United States Patent [19]

Roveti

[11] Patent Number: 5,248,934
[45] Date of Patent: Sep. 28, 1993

[54] METHOD AND APPARATUS FOR CONVERTING A CONVENTIONAL DC MULTIMETER TO AN AC IMPEDANCE METER

[76] Inventor: Denes K. Roveti, 240 Old Mill Bottom Rd., Annapolis, Md. 21012

[21] Appl. No.: 819,172

[22] Filed: Jan. 10, 1992

[51] Int. Cl.⁵ .................... G01R 15/12; G01R 27/02
[52] U.S. Cl. .................... 324/115; 324/650; 324/691
[58] Field of Search ............ 324/115, 128, 430, 502, 324/650, 691

[56] References Cited

U.S. PATENT DOCUMENTS 3,689,830  9/1972  Caldwell et al. .................... 324/502
3,753,094  8/1973  Furuishi et al. .................... 324/430
3,851,641 12/1974  Toole et al. ........................ 324/650
3,873,911  3/1975  Champlin .......................... 324/430

Primary Examiner—Ernest F. Karlsen
Attorney, Agent, or Firm—Foley & Lardner

[57] ABSTRACT

An R/Z converter for use with a conventional digital multimeter (DMM) provides enhanced capabilities of the DMM in measuring impedance and other functions where DC measurements are undesirable. The R/Z converter converts the test voltage of a conventional DMM into a square wave that is applied to the device being tested. The voltage from the tested device is seen by the DMM as an average DC value that is proportional to the impedance of the device.

24 Claims, 9 Drawing Sheets

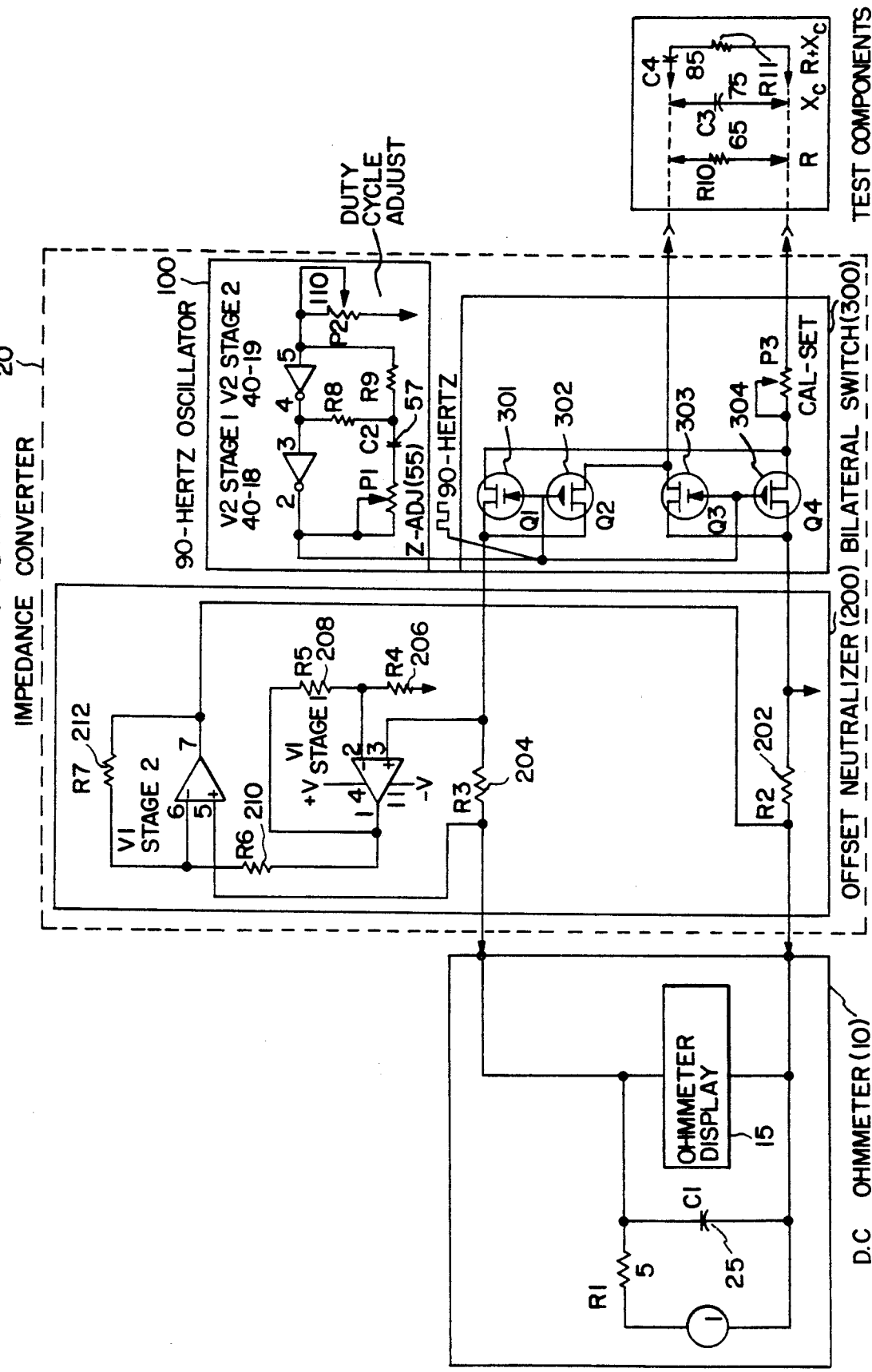

Fourier equation $$y = A_1 \sin \omega t + \frac{A_1}{3} \sin 3\omega t + \frac{A_1}{5} \sin 5\omega t + \frac{A_1}{7} \sin 7\omega t + \ldots \text{etc.}$$

where $A_1 = \frac{4}{\pi}$ times the height of the rectangle.

The addition of only three harmonics gives a fair approximation of the rectangular wave.

FIG. 5

Typical DMM 60-Hertz A.C. Resistance Response 20-Hertz Converter Error at 10 Megohms Only-1%

60-Hertz A.C. Resistance Five DMM Ohms Ranges 2 Kilohms to 20 Megohms in Kilohms

| D.C. Resistances Accuracy ±1% | FLUKE Model 45 | FLUKE 21-2 Series | METEX M 4650 | BECKMAN DM-27 | SPERRY DM4000A | Average % Error |
|---|---|---|---|---|---|---|
| Set to 1.000 K | 1.000 | 1.000 | 1.000 | 1.000 | 1.000 | ±0 |
| 10.00 K | 10.00 | 10.00 | 10.00 | 9.98 | 9.96 | ±0.1 |
| 100.0 K | 100.1 | 100.4 | 100.4 | 99.9 | 99.8 | ±0.1 |
| 1,000. K | 996. | 997. | 995. | 985. | 982. | ±0.8 |
| 10,000. K | 9,520. | 9,500. | 9,529. | 9,450. | 9,500. | ±5.0 |
| RS-232 Output | Yes | No | Yes | No | No | |

FIG. 6

Typical DMM 60-Hertz Capacitive Reactance Response

60-Hertz Capacitive Reactance Only- Five DMM Ohm Ranges: 30 Kilohms to 20 Megohms

| CAPACITOR ±1% | | FLUKE Model 45 | FLUKE Model 21-2 Ser. | Metex M4650 | Beckman DM-27 | Sperry DM4000A | Average % Error |
|---|---|---|---|---|---|---|---|
| C | $X_a$, ±60Hz | | | | | | |
| 250 pf | 10.6 Meg | 10.8 Megohms | 10.8 Meg | 10.4 Meg. | 9.5 Meg | 9.4 Meg | -2% |
| 500 pf | 5.3 Meg | 5.50 Meg | 5.45 Meg | 5.45 Meg. | 5.2 Meg | 4.98 Meg | ±0.1% |
| 1 nf | 2.65 Meg | 2.69 M | 2.69 M | 2.67 M | 2.55 M | 2.55 K | -0.8% |
| 10 nf | 265 Kilohms | 275 Kilohms | 276 Kilohms | 276 Kilohms | 274 Kilohms | 276 Kilohms | -3% |
| 0.1 uf | 26.5 K | 26.5 K | 24.6 K | 24.7 K | 24.2 K | 24.5 K | +7% |

FIG. 7

R + $X_C$ In Parallel.

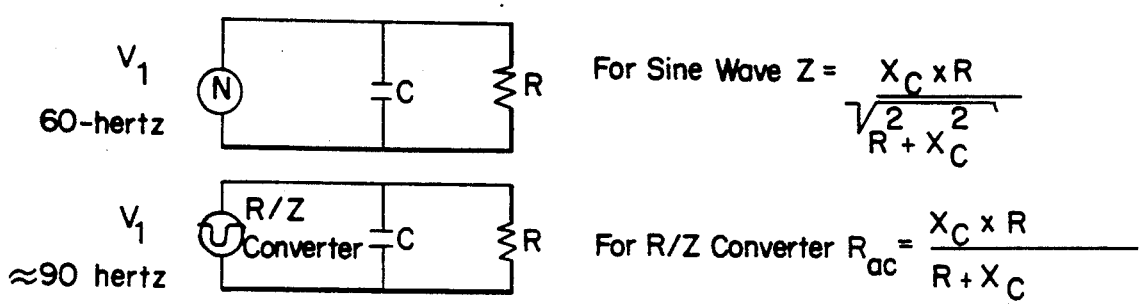

For Sine Wave $Z = \dfrac{X_C \times R}{\sqrt{R^2 + X_C^2}}$

For R/Z Converter $R_{ac} = \dfrac{X_C \times R}{R + X_C}$

FIG. 8

Calculating Impedances and Phase Angles of Series Circuits.

$$Z = \sqrt{R^2 + (X_L - X_C)^2} \;;\; X_L = 2\pi f L \text{ ohms} \quad X_C = \dfrac{1}{2\pi f C} \text{ ohms}$$

R and L  $\quad Z = \sqrt{R^2 + X_L^2}$ $\qquad$ R and C $\quad Z = \sqrt{R^2 + X_C^2}$ R only  $Z = R$ $\qquad$ C or L only  $Z = X_C\;;\; Z = X_L$ Phase angle R  cosine $\angle = \dfrac{R}{Z}$ ; Phase angle L  $\tan \angle = \dfrac{X_L}{R_{ac}}$ Phase angle capacitive  $\tan \angle = \dfrac{X_C}{R_{ac}}$ Units: f in hertz $\quad$ L - henries $\quad$ C - farads

FIG. 9

Typical DMM 60-Hertz Series R-C Impedance Response.

Five DMM Ohms Ranges 20/30 Kilohms to 20/30 Megohms.

| 60-Hertz Series R+C; R=$X_C$ | | | | FLUKE | | BECKMAN DM-27 | SPERRY DM4000A | AVERAGE % ERROR |
|---|---|---|---|---|---|---|---|---|
| $\sqrt{R^2 + X_C^2}$ = $\frac{Z}{Z}$ | | | | Model 45 | Model 21-2 | | | |
| R | C | $\frac{X_C^2}{Z}$ | | | | | | |
| 10.6 Meg | 250 pf | 15 Meg | | 13.8 M | 13.7 Megohm | 14.1 | 12.7 M | -7.7% |
| 5.3 Meg | 500 pf | 7.5 M | | 7.28 M | 7.30 M | 7.30 | 7.29 M | -4 % |
| 2.65 Meg | 1 nf | 3.75 M | | 3.60 M | 3.65 M | 3.59 | 3.65 M | -3.3% |
| 265.0 Kilohms | 10 nf | 375.0 Meg | | 379.0 K | 381.0 K | 380.0 | 380.0 K | +1.4% |
| 26.5 K | 100 nf | 37.5 K | | 37.4 K | 37.3 K | 37.2 | 37.1 K | -0.5% |
| 5.3 K | 500 nf | 7.5 K | | 7.25 K | 7.24 K | 7.2 | 7.2 K | -3.6% |

*METEX M4650 column:* 13.9 M / 14.1 (M) ; 7.31 M ; 3.64 M ; 380.0 K ; 37.4 K ; 7.25 K 50-Hertz Series R+C

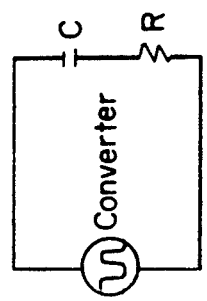

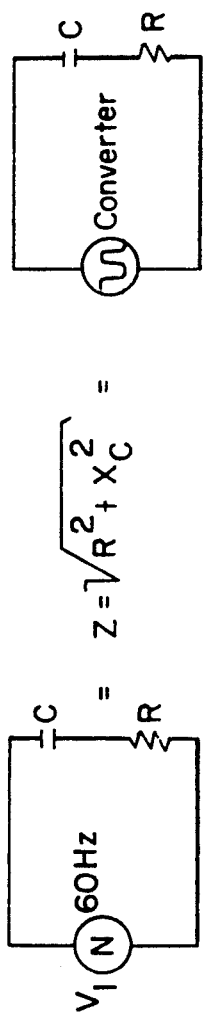

FIG. 10

$R + X_C$ In Series. $R = X_C$ $R + X_C = Z = \sqrt{R^2 + X_C^2} =$

FIG. 11

V-1 Values For DMM Ohms Range

| DMM Ohms Ranges | 3-1/2-Digit Ohms Resolution | Full Scale Voltages | Short Circuit Currents in uA |
|---|---|---|---|
| 200 Ohm | 0.1 | 0.1 - 3 | 100 - 2,000 |
| 2 Kilohms | 1.0 | 0.08 - 0.3 | 50 - 600 |
| 20 Kilohms | 10.0 | 0.15 - 0.45 | 5 - 75 |
| ↓ ——————————— SAFE CURRENT RANGES ——————————— ↓ | | | |
| 200 Kilohms | 100 | 0.2 - 0.45 | 1 - 12 |
| 2 Megohms | 1 Kilohm | 0.2 - 0.45 | 0.5 - 1.2 |
| 20 Megohms | 10 Kilohms | 0.2 - 0.45 | 0.1 - 1.0 |

METHOD AND APPARATUS FOR CONVERTING A CONVENTIONAL DC MULTIMETER TO AN AC IMPEDANCE METER

BACKGROUND OF THE INVENTION

1. Field of the Invention

The present invention relates to measurement of impedance using an ordinary digital multimeter which was originally designed to provide only DC test voltage. Specifically, an AC resistance converter enhances the capabilities of conventional digital multimeters by providing both the ability to measure impedance of active components (capacitors and inductors) and by also providing more accurate measurements for tests for which DC test voltages/currents obscure results or effect the material being tested.

2. Description of the Related Art

It is estimated that at least 10 to 20 million digital multimeters (DMM) are in use in the U.S. Conventional DMMs are designed to measure five basic functions: (1) DC voltage (2) DC current (3) DC resistance (4) AC current and (5) AC voltage. But conventional DMMs are not designed to measure impedance, which reflects the capacitive, inductive and resistive components of an active circuit.

The conventional DMMs measure resistance using only DC test voltages. DC measurements do provide (1) high accuracy (2) reduced AC interference by using a DC to few hertz bandwidth (3) rejection of capacitive and inductive circuit components (4) low cost and (5) interchangeability.

Despite the conventional DMM's versatility, there are desirable functions that it cannot perform. Conventional DMMs are restricted to applications where the uni-directional test current does not alter the measurement's accuracy or obscure the data to be measured by the DMM. If there is a difference in the ohmic bipolar measurement caused by the presence of unbalanced currents, non-linear conduction, etc., the DC test current of conventional DMMs is ineffective.

The DMM manufacturers frequently include additional features in the DMMs, such as continuity, frequency, capacitor, diode and transistor tests, and conductivity functions. Ironically, many of the conductivity measurements must be made by AC and not by DC signals to preserve true polarization and ion balance in the materials being tested.

There are a wide variety of potential applications for a DMM that provides AC test voltages. For example:

AC resistive and reactive components can be measured with vector quantities in the RLC series mode. The phase angle is known once the capacitance is measured. Resonance effects can be studied; Resistances can be measured up to $10^{10}$ ohms.

Such a device could be used to measure non-voltage producing non-linear elements. Non-linear elements, materials, fluids, and gases do not produce a proportional change in current with the applied voltage in one or bipolar direction. For example, a diode is a non-linear unipolar element allowing current to flow in one direction. Another example is the tightly-bound conducting molecular polymer chains containing positive and negative polarized ions. Ohm measurements using DC voltage will affect the ion balance and true information may be lost.

Such a device could be used to measure the AC resistance of DC devices and sources. The internal AC resistance of low current watch batteries when new may be 5 to 10 ohms. Their internal resistance increases with use. DC battery testers fall short of the AC tests as they use an arbitrary DC test current to measure a non-linear resistance.

Insulation resistance tests of cables and materials are conducted with DC voltages. Due to aging and corona discharge (ionization of the air), the quality of the dielectric degrades. Insulation deteriorations can be measured with an AC capacitive-coupled impedance meter or a conventional DMM with an R/Z converter.

The R/Z converter can also be utilized to measure conductivity. The passage of electrons or ionized atoms in fluids causes conductivity. To avoid chemical reactions caused by DC DMM's test probes in fluids which obscure the effective resistance, conductivity measurements are made by AC voltages. A conductivity probe or a noble metal interdigitized ceramic sensor may be used. Conductivity variations between de-ionized distilled or tap waters exceed 100 to 1 ratio. Water conductivity tests are widely used to verify safe acceptable limits.

Applications are also possible for voltage producing processes. For example, under normal use, diodes do not produce voltage but when the p-n junction is excited to higher energy levels by intense light or radioactive radiation, it emits electron flow and produces several tenths of a volt open-circuit potential. Similarly, in chemical processes in oxidation (a chemical reaction in which a compound loses electrons) or in reduction (when the compound gains electrons), several volts may be generated between electrodes or electrode-like surfaces.

Membrane potentials provide more important applications. A difference in potential that exists when two dissimilar electrodes are connected through a solution or gel causes electrochemical reactions. This is also referred to as membrane potential as a potential difference exists through the living cell membranes. These voltages are also present in patient-lead connected electrodes. When the skin surface of the patient and electrodes are connected through a conductive means, such as, gel or when taking electrocardiograms (ECG) or electroencephalogram tests, typical DC levels are from 0 to +150 millivolts and may reach 500 millivolts. These voltages can cause interference when taking ECG readings. To avoid errors caused by the DC offset, AC impedance measurements are used for ECG tests or when testing impedances of patient-connected electrodes.

Galvanic reactions and corrosions occur when dissimilar materials (metals, salts, etc.) when conduction exits between them. Conductive paths can be through humid air, gases, or fluids. The oxidation rate of metals or alloys can be measured and neutralized.

The Peltier Effect occurs when different types of metals are joined together at different temperatures, producing a DC voltage differential, unbalancing the DC resistance measurements. This principle is used in cooling, due to current flow, heat is generated and absorbed at the junction of the two dissimilar metals.

Between the space of any two electrically-connected material, a DC voltage is generated. To avoid errors at low resistance measurements, an AC test signal is often used.

SUMMARY OF THE INVENTION

Therefore it is an object of the present invention to provide an R/Z converter for a conventional DMM that enhances the conventional capabilities of the DMM so that additional electrical measurements can be made that a scientist of hobbyist may require. More specifically, it is intended to provide an R/Z converter that permits a DMM to measure "AC resistances" and impedances and other AC dependent parameters.

It is another object of this invention to provide these enhanced capabilities for a conventional DMM at low cost so that the hobbyist or others with budgetary limitations are able to enjoy the advantages of the additional features provided by this invention.

It is a further object of the invention to provide an R/Z converter that converts a DC test signal to a square wave thus making possible a wide variety of potential AC applications.

The applications made possible with the R/Z converter include (1) impedance measurements including resistive, capacitive and inductive components (2) measurement of resistance in the presence of DC voltages (3) measurement of conductivity or resistance without affecting the ion balance in fluids and solids, semiconductors or conductive polymers etc. and (4) internal resistance measurement of low current batteries and electro-chemical processes.

Other objects and advantages of this invention will become apparent from the following description and accompanying drawings.

BRIEF DESCRIPTION OF THE DRAWINGS

FIG. (1a) shows a first simplified embodiment of the invention measuring capacitive loads.

FIG. (1b) shows measurement of inductive loads.

FIG. (1c) shows an embodiment of the invention for measuring resonance.

FIG. (2a) shows waveforms generated by the invention that depend upon the kind of load being tested.

FIG. (2b) shows waveforms for inductive loads and for resonance.

FIG. (3) shows another simplified embodiment of the invention.

FIG. (4) shows Fourier approximations of a square wave.

FIG. (5) shows typical DMM 60-Hertz resistance response for typical DMMs.

FIG. (6) shows typical DMM 60-Hertz Capacitive Reactance Response for typical DMMs.

FIG. (7) shows circuits and equations relating to Parallel Measurements of $R + X_C$.

FIG. (8) shows calculations for impedances and phase angles for series circuits.

FIG. (9) shows typical DMM 60-Hertz R-C series response.

FIG. (10) shows equivalent R-C series circuits for 60 hertz sine wave and R/Z converter.

FIG. (11) shows $R + X_C$ values for DMM ohms ranges.

DETAILED DESCRIPTION OF THE PREFERRED EMBODIMENTS

FIG. (1a) shows a simplified schematic of one embodiment of the invention. R/Z converter 20 is comprised of a double-pole electronic polarity reversing switch 40 and a 90 hertz signal 30 for reversing the switch. The R/Z converter is connected to a conventional DC ohmmeter 10 with an internal resistance R1 (5) and an internal capacitance C1 (25). The reversal rate of the switch is approximately 90 hertz.

The electronic switch can be driven by a 9-volt battery (not shown) and it is floating with respect to both input and output terminals. Under no-load conditions, the reflected impedance of the R/Z converter to the input of the DMM is a steady state picoampere DC open circuit current. This is due to the finite switching time and stray resistive and capacitive components of the R/Z converter. The DMM sees an open circuit resistance of several hundred megohms.

Figure 1A:
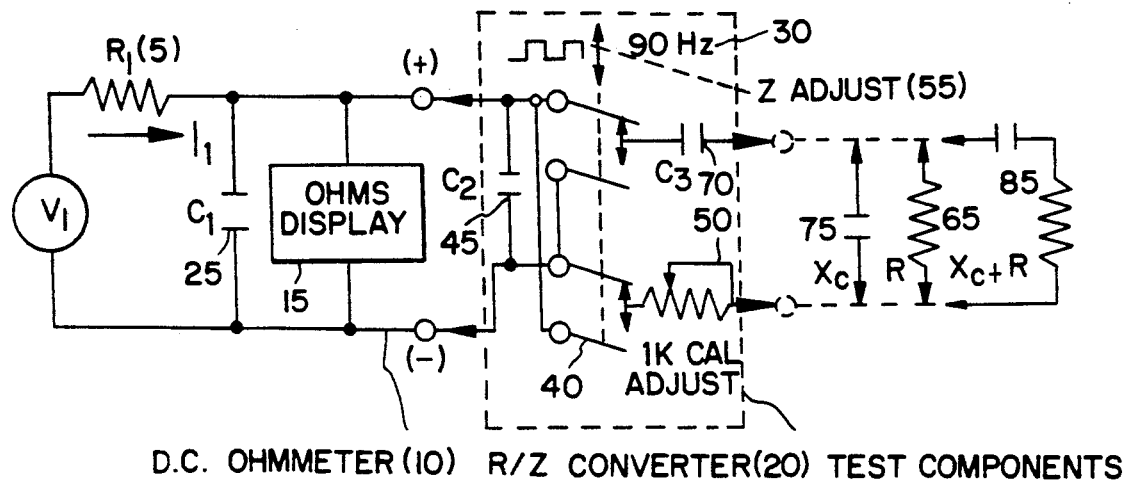

The R/Z converter functions to convert the DC test voltage from the ohmmeter 10 into a 90 hertz square wave. As is shown in FIG. 1a, the R/Z converter can be utilized to measure a resistive load R (65), a capacitive load $X_C$ (75), or a series load of $X_C + R$ (85). The resulting measured impedance is then read on the ohmmeter display 15.

A calibration/current limiting resistor 50 is incorporated in the R/Z converter 20. This variable resistor 50 has four functions: (1) to balance out the inherent low ohmic switching resistances; (2) to limit the current in case of excessive peak currents from the in/out terminals (3) to calibrate, reference the 1,000-ohm offset is to be subtracted from readings; (4) to correct for semiconductor junction temperature variations and battery aging. An impedance adjust 55 is also provided to allow accurate Z settings in the various ohmmeter ranges by varying the frequency of the square wave.

Capacitor $C_3$ (70) is an output coupling capacitor used to prevent DC getting into the load. This allows measurements such as AC impedance measurements on live DC circuits.

Figure 4:
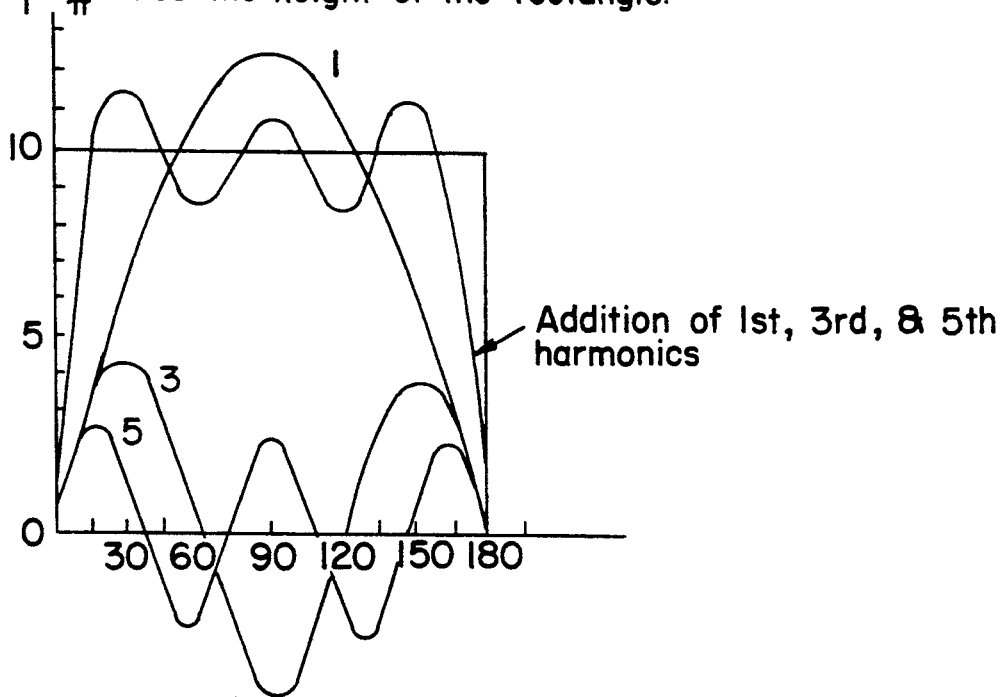

A square wave response is used in electronics to characterize a network or device when the square wave is applied to its input. Similarly, square wave is used in analyzing AC machinery. FIG. 4 shows the Fourier equation for a square wave and three sine wave harmonics approximating square wave responses. A dozen odd sine wave harmonics gives nearly a perfect square wave.

Electrical impedance Z is defined in terms of a sinusoidal-varying electrical wave having a real component, R, and a second quantity that modifies it in phase and behavior, C and L. In a broad sense of definition, impedance is the ratio of a steady state voltage-like vector quantity to a steady state current-like vector quantity. Impedance pertains to a single frequency in the steady state. For a square wave, impedance and phase angle are determined by the many sinusoidally-varying low and high frequency harmonics.

Using the R/Z meter, the unknown resistance is measured by a square wave with a peak-to-peak amplitude twice the DC ohmmeter test voltage. This square wave is shown as the test voltage waveform in column A of FIG. 2a. The symmetry of the square wave is set to 50% duty cycle so as to produce minimum DC offset. When a purely resistive load is connected to the test terminals, the reflected DC equivalent square wave resistance can be read within a few percent accuracy by a DMM.

FIG. 2, column A, shows that when a resistive load is applied, $Z = R_{DC}$, the test voltage and the test current wave form are approximately the same. When it is inverted, the DMM sees close to a perfect DC level as the DC ohmmeter internal capacitance integrates the finite switching pulses of the square wave.

The charge/discharge system in FIG. 2 generates a 60-hertz impedance synthetically. For a purely resistive component, $Z=R_{AC}=R_{DC}$, the ohms display 15 is independent of frequency below 1 megohm. At high impedances, $R_{AC}\neq R_{DC}$, due to stray capacitance, open circuit resistance and capacitive switching components. The R/Z converter open circuit resistance is over 1,000 megohms with a 20-hertz square wave but approximately 300 megohms with a 90-hertz square wave. For high AC impedance applications, the low frequency square wave limit is set by the time constant of the DMM. For stable DMM readings, a square wave 100 times faster than the R-C time constant is desirable: For example, if the DMM's 2,000-megohm range response is 10 seconds, the square wave frequency should be 10 hertz.

FIG. 5 shows five commonly used DMMs with resistance test data with 60-hertz converter with the 1,000-ohm internal calibration resistor 50 (in FIG. 1a) adjusted at 1,000 ohms, readings are within −5% up to 10 megohms and −10% up to 20 megohms. When measuring below 100 ohms, depending on the DMM make and range, a few ohms to 10 ohms variation may be resolved. Shielding can effectively reduce the affect of 60-hertz interference.

For higher accuracy, above 10 megohms, a 20 hertz square wave R/Z converter can be used. It produces a deviation of only −1% at 10 megohms and −2% at 20 megohms due to its 1,000-megohm internal resistance. To measure these high resistances, a Beckman Model DM25 or D27, may be used with its 2,000-megohm range. Once internal resistance of the converter is known, one can measure reliably 10,000 megohms, $10^{10}$ ohms, by measuring the drop in the internal R display when load is connected. Errors are within ±5% at $10^{10}$ m ohms.

The fast square wave plus/minus rise times can be used to charge and discharge the capacitive and inductive loads $X_C$ and $X_L$. If the charge/discharge rates are rectified and integrated, an effective DC current flow exists. Over several decades of impedance, the effective current is proportional to the magnitude of the AC reactive components. The DC Ohmmeter sees C and L as an equivalent DC resistance.

Figure 2A:
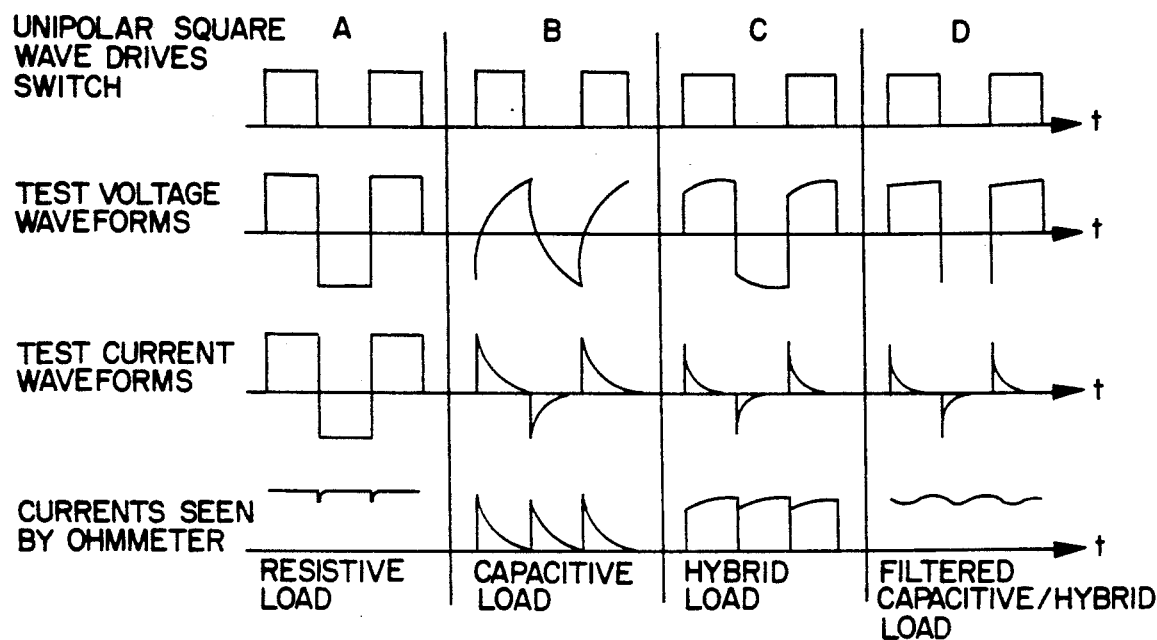

With a capacitive load connected to the R/Z converter, as in FIG. 2a, column B, the square wave frequency can be adjusted with Z adjust 55 so that the 60-hertz, $X_C$ reads correctly on the DMM. This can be accomplished by utilizing a known capacitive load. As the square wave frequency increases, the average current level dissipated by the capacitor also increases. Voltage across the capacitor at any moment is given by $V_C=Q/C$. Therefore, it is proportional to the charge rate resulting in a current $I=Q/T$. Hence, the amount of current reflected to the DMM does not depend on the voltage but it is proportional to the rate of change of voltage.

When the square wave frequency is increased, at some current level the capacitive reactance will be equal to a 60-hertz equivalent sinusoidal impedance ($ESI_{60}$) as seen by the ohmmeter. This occurs approximately at 50% higher square wave frequency than its equivalent sine wave, or $ESI_{60}$ is approximately $SQ_{90}$. In other words the DMM will see an impedance from a 90 hertz square wave that is equivalent to the impedance of a 60 hertz sine wave.

FIG. 2a, column B shows that when a pure capacitive load is applied to the R/Z converter, the voltage current relations are no longer true square waves. The test voltage wave form becomes a bipolar exponential wave producing charge/discharge cycle test currents. These current waves are converted and averaged by the DMM. Readings will be lower than expected as the ohmmeter's internal RC time constant cannot maintain the mean DC level corresponding to $X_C$.

The hybrid load (FIG. 2a, column C) has equal capacitive/resistive components resulting in a less distorted test current. Readings are still low due to the short RC time constant. The DMM reads the average DC value of the rectified charge/discharge square wave current. Digital ohmmeters expect a response close to the resistive load. This is done by swamping out the DMM 10 to 100 nanofarad internal capacitance 25 (C1 of FIG. 1) by several orders of magnitude with capacitor 45 (C2). Note that C2 can be implemented using several methods including a socket to insert C2 or a switch to switch in C2. These methods are not shown as they are well known in the field. A higher capacitance across the DMM will produce a square wave similar to the resistive load test voltage and integrate the AC test current pulses for a longer period and make different manufacturer's ohmmeters have the same low AC impedance. As long as the impedance under test has a charge time much less than the square wave duty cycle, the current seen by the ohmmeter will be proportional to the reactive components ($X_C$). This is shown in FIG. 2a column D.

The Z adjustment knob (55 in FIGS. 1 and 3) is provided on the R/Z converter to measure $X_C$ accurately. Errors can be kept within a few percent per decade with the Z adjust. In one embodiment, this control sets the operating frequency from approximately 70 to 100 hertz. The test data shown in FIG. 6 was set to be accurate in the 500-pf range using the DMM's 20 to 30-megohm scale.

With an external capacitor added across the DMM having 10 to 20 times larger capacitance than the $X_C$ value to be measured, the measurement range accuracy can be extended to microfarads.

Very small capacitance values of a few picofarads can be measured when using the equivalent shunting effect across the open circuit converter R. The 20-hertz square wave converter where R sine wave = 13.3 hertz has 1,000 megohms open circuit R. $X_C$ at 13.3 hertz of a 1-picofarad capacitor is 11,954 megohms when put in parallel with the converter. The DMM reads according to Ohm's Law, 922.8 megohms ±5%.

For $R+X_C$ in parallel, the phase shift in the R-C parallel circuit is not recognized since the R/Z converter presents the average parallel AC impedance to the DMM, and does not differentiate between R and $X_C$. Hence instead of reading actual vector impedances, DMM gives parallel $X_C$ and R values. For small or large angles, the error is low. FIG. 7 gives the impedance equations for parallel RC circuits and for that measured by the R/Z converter. The measured parallel $R=X_C$ values correspond within ±10% from a few kilohms to 20 megohms to the impedance actually seen at one sine wave frequency, $R_{AC}=(R*X_C)/(R+X_C)$.

For series circuits, some basic equations relating to impedance and phase angle calculations are shown in FIG. 8. The 60-hertz vector quantity is displayed in the series mode as the R/Z converter sees the resistive and the capacitive reactance as a 60-hertz sinusoidal equivalent, therefore, gives it the same value in terms of charge/discharge as the equivalent 60-hertz impedance vector quantity. FIG. 9 shows these impedances as measured by five commonly used DMMs with the R/Z converter, the total error is within ±5%. No Z Calibration knob was used for these results. Measurement ranges may be extended below 1 kilohm by using an external capacitor across the DMM.

Figure 1B:
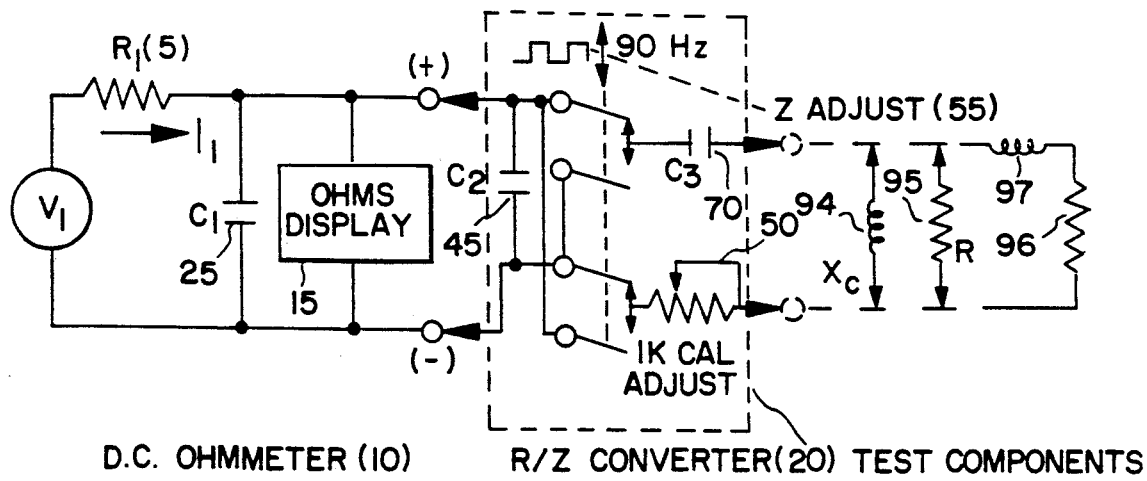

The R/Z converter can also be used to measure inductive loads as shown in FIG. 1b. For an inductive load, the induced electromagnetic force opposes any change in current while a capacitor opposes any change in voltage. Thus current leads voltage in a capacitor and lags voltage in an inductor. In capacitors, for sinusoidal waves, the current leads the voltage by 90°, whereas in inductors, the current lags the voltage by 90°. $X_L$ and $X_C$ are 180° out of phase. For the R/Z converter, the 180° phase differential means an interchange of the test voltage with the test current. The square wave does not recognize phases, only polarity change at every half period. The R/Z converter generates charge/discharge time constants of R - C - L in each half period. As long as the RC or the R/L time constants are kept within 10% of the half period, accurate impedance measurements can be made with the majority of the DMMs.

Figure 2B:
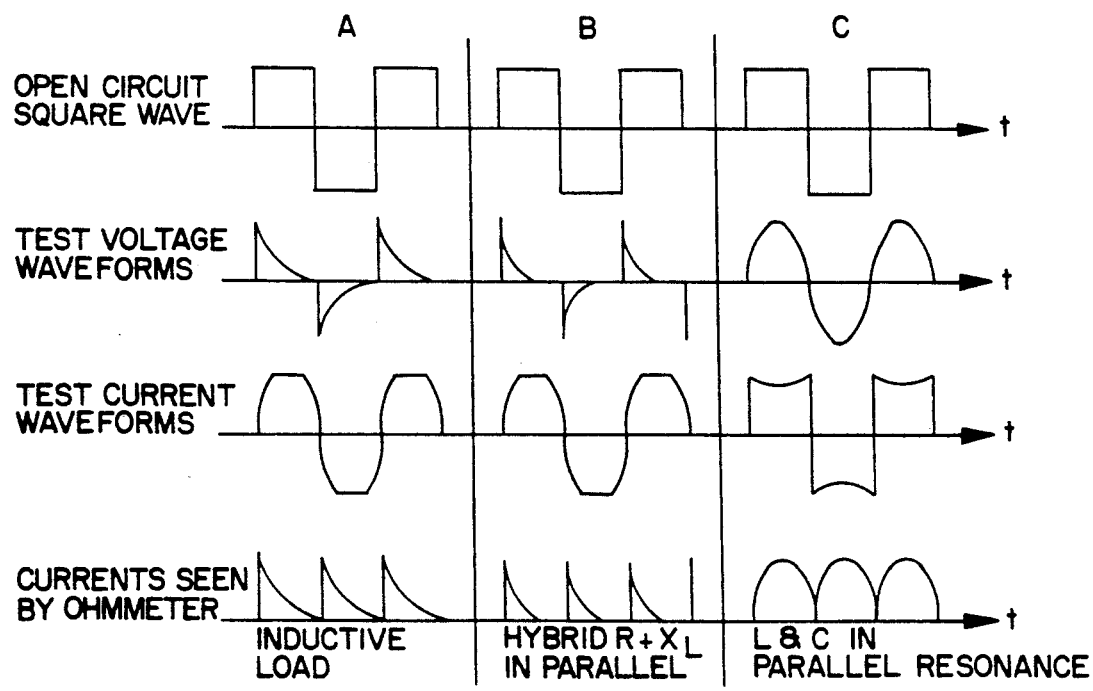

Waveforms for inductive loads are shown in FIG. 2b. Column A shows an inductive load. Column B shows a hybrid load with $R+X_L$ in parallel. The rectified charge/discharge pulses are integrated by the DMM and it displays $X_L$ at 60 hertz. Measurement ranges for one particular embodiment extends from 0.1 henry to 30 henries. Measurements can be extended (e.g. to 50 henries) using the Z cal adjust.

When a purely inductive component is connected to the R/Z converter, the DMM input should have low capacitance (approximately 10 to 50 nanofarads). This capacitance level is negligible when measuring inductance in the 0.1 to 30 henry range. Typical battery chargers have a primary winding inductance of 2 to 5 henries or an $X_L$ of 756 to 1890 ohms.

The R/Z converter recognizes the parallel combination of $X_L$ and R (94 and 95 in FIG. 1b) as a vector quantity, $(X_L * R)/(X_L^2+R^2)^{\frac{1}{2}}$, unlike the parallel combination of $X_C$ and R. This can be explained as the voltage - current discharge cycles are interchanged. Errors can be minimized using the Z adjust, and accuracies of 1% to 2% are typical per decade of inductance. Optimum inductance range for most multimeters for one embodiment of the invention is in the range of 0.5 to 5 henries.

For $X_L$ in series with R the R/Z meter measures these as non-vector quantities, the sum of their magnitudes $X_L+R$. For DMMs measuring these quantities, 5% accuracy can be achieved from 0.5 to 10 henries, once the Z adjust is set to balance the ±errors.

Figure 1C:
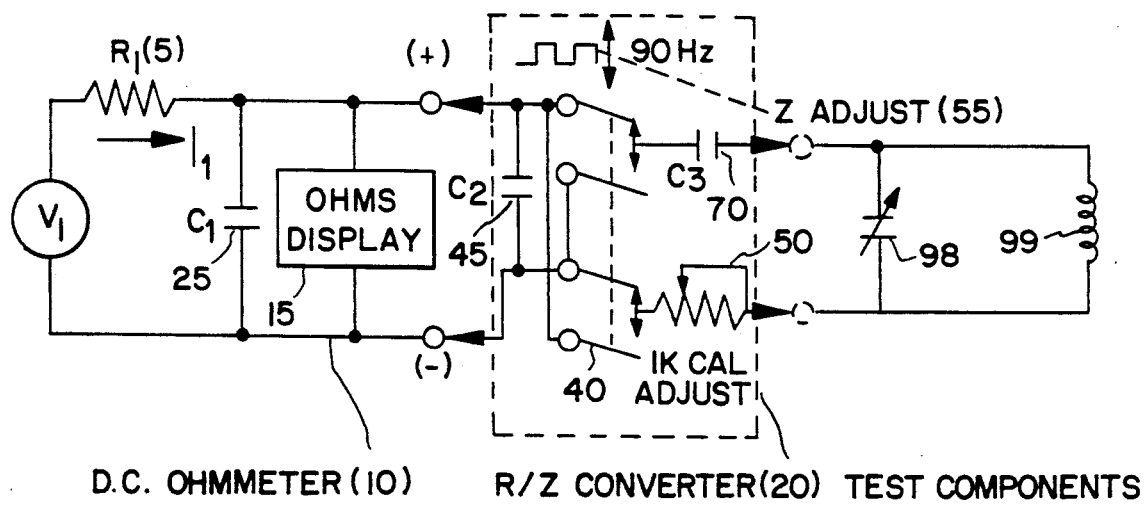

FIG. 1c shows that the R/Z converter can also be used to measure Q and resonance by connecting a variable capacitor 98 in parallel with $X_L$ 99 and adjusting the capacitance until parallel resonance is achieved.

Resonance occurs at frequency $f_o$ where $$f_o = \frac{1}{2\Pi \sqrt{LC_o}}$$

The equation for $f_o$ is derived by equating $X_L=X_C$. The $f_o$ is 90 hertz and the L, $C_o$ values are the equivalent 60 hertz impedance values. The equation above can be simplified to find L in henries, C in microfarads, and $f_o$ in hertz.

$$1)\ f_o = \frac{159}{\sqrt{L \times C_o}} \quad 2)\ L = \frac{25300}{f_o^2 \times C_o} \quad 3)\ C = \frac{25300}{f_o^2 \times L}$$

With the R/Z converter, the DMM displays the maximum value of the parallel resonance impedance. Resonance is set by adjusting the variable capacitor 98 in parallel with the fixed inductor 99. For example: test data of 10 henries inductance gives a 3.8 kilohm $X_L$ display on the DMM (instead of 3.78 kilohms). Connected in parallel, the variable capacitor at 310 nanofarad, the DMM display is $Z_o=37$ kilohms or a $Q=Z_o/X_L$ of 9.7. Data with other meters gave a Q value between 9 and 11. FIG. 2b column C shows waveforms under resonant conditions. The test voltage is a sine wave with a few percent harmonic distortion. The DMM averages the rectified 90-hertz sine wave and displays the 60 hertz resonance impedance value.

With L and C in series, as the capacitance is adjusted and, as expected, the voltage gradually decreases as long as the circuit is capacitive. In this mode the R/Z converter recognizes R and C in series as a vector quantity. Once resonance is passed, the inductor with series R is not recognized as a vector quantity by the converter. A low frequency oscillation of a few hertz takes place.

Another embodiment of this invention is shown in the simplified schematic of FIG. 3. As in FIG. 1, the three basic components of the device are the conventional ohmmeter 10, the impedance converter 20 and the test components R (65), $X_C$ (75) or $R+X_C$ (85).

The Impedance Converter 20 is in turn comprised of the 90 hertz oscillator 100, the offset neutralizer 200 and the bilateral switch 300. Each of these functions will be described in turn.

The 90 hertz oscillator 100 is a basic 2 inverter oscillator set to a nominal 90 hertz. Whatever state (High or Low) is present at pin 4 of stage 2 is inverted by stage 1 with the output at pin 2. This voltage differential creates a current flow through capacitor C2 (57) causing a charge build-up in C2. When this charge reaches a level sufficient to cause a logic change at pin 5 of stage 2, that change is inverted with output at Pin 4, which in turn causes Stage 1 to invert the signal at Pin 2. The capacitor C2 (57) now discharges and charges in the opposite direction and the cycle repeats as long as the circuit is energized. The frequency of oscillation is variable, through the Z-Adjust potentiometer, from approximately 80 to 100 hertz. The Duty Cycle is set up to 50% with the Duty Cycle Adjust potentiometer 110. The output is a 9 volt unipolar square wave.

The bilateral switcher 300 is comprised of two sets of FET switches, each set containing one depletion mode (301, 303) and one enhancement mode FET (302, 304) with the gates tied as shown in FIG. 3. The 90 Hertz oscillator signal feeds the gates of all FETs simultaneously, causing them to switch on and off in pairs. $Q_1$ (301) and $Q_3$ (303) turn on together, while $Q_2$ (302) and $Q_4$ (304) are turned off. Then, $Q_2$ (302) and $Q_4$ (304) turn on together, while $Q_1$ (301) and $Q_3$ (303) are turned off. The switching configuration is such that the polarity of the ohmmeter test signal is reversed at a rate of 90 Hertz. This reversal causes the signal from the ohmmeter to be first a positive signal and then a negative signal, of equal magnitude, when viewed from the test components. Hence, the peak-to-peak signal, at the test components, is twice the ohmmeter output signal. The ohmmeter "sees" the rectified square wave DC signal and, by virtue of integration across the $R_1C_1$ combination in the ohmmeter, reads the average ohmic value of the test component.

The offset neutralizer 200 functions as follows. Sampling resistors, R2 (202) and R3 (204), are placed in series with both legs of the ohmmeter. Stage 1 of the offset neutralizer monitors the voltage level present at one end of R3 (204), while stage 2 monitors the voltage level present at the opposite end of the resistors. Resistors R4 (206), R5 (208), R6 (210) and R7 (212) are equal, thus both stages have a gain of 2. Since pin 2 of Stage 1 is tied to ground through resistor R4 (206), the signal seen at pin 3 is doubled with output at pin 1. The voltage level seen at pin 5 sets the reference of stage 2. The difference between this reference and the output signal from stage 1 (which is input to pin 6 through R6 (210)) is then doubled with output on pin 7. This voltage difference equals the Error Offset current between the ohmmeter and the bilateral switch, and the "On" resistances of the FET devices and other stray resistances present in the switching circuitry. The output from pin 7 (stage 2) is then fed back into the ohmmeter to balance out the Error Offset. The Cal-Set potentiometer (P3) in the bilateral switch 300 is used to null any remaining offset.

For many applications, the DMM open circuit voltage and maximum short circuit current is of concern. The main purpose of AC resistance measurements is to obtain actual and accurate test data with low current and voltage without affecting the environment under test. DC ohmmeters use widely varying currents up to a few milliamperes and open circuit voltages of several volts. FIG. 11 shows expected V maximum, I maximum limits on the 200-ohm to 20-megohm ranges of five multimeters. Safe ohmmeter current ranges should be verified before tests. The effective heating value of DC and square wave current is the same. In all critical medical, chemical, and polymer sensor applications, the current is to be maintained below 10 microamperes, DC or AC rms. See Safe Current Limit standards AAMI, NFPA, U.L. etc.

To ensure safe use of the DMM, FIG. 11 test data limits useable ohm ranges above the 200-kilohm settings. A reading resolution to the nearest ±100 ohms is obtained with a 3½ digit or 10 ohms resolution with a 4½ digit DMM. This accuracy is more than sufficient for most applications in the field of medicine, chemistry, including applied polymer research, polymer humidity sensors and other types of sensors requiring AC excitation. The 200-ohm, 2-kilohm and 20-kilohm ranges are to be used with caution since the test currents may affect humans and samples being tested above 50 to 100 microamperes.

It will be apparent to those skilled in the art that various modifications and variations may be made to the method and apparatus of the invention without departing from the scope of the invention. It is, therefore, to be understood that, within the scope of the appended claims, the invention may be practiced otherwise than as specifically described.

What is claimed is:

1. An apparatus for adapting a conventional ohmmeter to measure the impedance of an object comprising:
   a converter means connected between the ohmmeter and the object for converting a DC test voltage output from the ohmmeter to an AC test voltage and outputting the AC test voltage to the object being tested, the converter means including;
   a polarity reversing switch connected between the ohmmeter and the object, the switch being supplied with the DC test voltage from the ohmmeter,
   a means for producing a switching signal with an adjustable frequency, the switching signal being supplied to the polarity reversing switch causing the polarity reversing switch to reverse polarity, thereby outputting the AC test voltage to the object being tested, and
   wherein the AC test voltage is outputted to the object being tested at a rate determined by the switching signal, such that current seen by the ohmmeter is proportional to the impedance of the object being tested, thereby allowing the impedance of the object to be read on an ohm scale on the ohmmeter.

2. An apparatus as recited in claim 1 wherein the AC test voltage generated is an open circuit square wave.

3. An apparatus as recited in claim 2, wherein the square wave generated by the converter means has a peak to peak amplitude that is twice the amplitude of the DC test voltage output by the DMM.

4. An apparatus as recited in claim 2, wherein the square wave generated by the converter means has s 50% duty cycle and minimum DC offset.

5. An apparatus as recited in claim 4 wherein the square wave generated has a frequency that is 1.5 times the frequency of an equivalent sine wave impedance desired to be measured.

6. An apparatus as recited in claim 5 wherein the square wave has a frequency of 90 Hertz to measure an equivalent sine wave impedance of 60 Hertz.

7. An apparatus as recited in claim 2, wherein the frequency of the square wave generated by the converting means is at least 100 times the internal R-C time constant of the DMM.

8. An apparatus as recited in claim 1 wherein the parallel impedance $R_{AC}$, is measured as $$R_{AC} = \frac{R \times X_C}{R + X_C}.$$

9. An apparatus as recited in claim 8, wherein the series impedance Z, is measured as the vector quantity:

$$Z = \sqrt{R^2 + X_c^2}.$$

10. An apparatus as recited in claim 9 wherein the parallel impedance $R_{AC}$, is measured as the vector quantity:

$$R_{AC} = \frac{R \times X_L}{\sqrt{R^2 + X_L^2}}.$$

11. An apparatus as recited in claim 10, wherein the series impedance Z is measured as $$Z = R + X_L.$$

12. An apparatus as recited in claim 1 wherein the converter means further comprises
   an offset neutralizer means connected between the ohmmeter and the component object being tested for correcting any DC offset caused by stray resistances in the converter means;
and wherein the switching signal means is an oscillator.

13. An apparatus as recited in claim 12 wherein the oscillator further comprises:
two inverters;
a potentiometer to adjust the oscillating signal from 80 to 100 hertz; and wherein the oscillating signal is a 9 volt unipolar square wave with a 50% duty cycle.

14. An apparatus as recited in claim 1 wherein the polarity reversing switch is comprised of two sets of first and second FETs, and the first FETs are depletion mode FETs and the second FETs are enhancement mode FETs, and only one of each set of FETs is on at a time, and the gates of all FETS are fed by the oscillating signal.

15. An apparatus as recited in claim 1 wherein the conventional ohmmeter is a digital multimeter (DMM).

16. An apparatus as recited in claim 15 wherein the means for producing a switching signal is an oscillator.

17. An apparatus as recited in claim 16 further comprising a shunt capacitance as an integrator at its input for capacitive loads and wherein the frequency of the switching signal is adjustable to adjust the AC test voltage so that when a capacitive/inductive load is connected to the apparatus, the DMM will read an equivalent sinusoidal impedance value on its scale corresponding to the reactive load.

18. An apparatus as recited in claim 16 further comprising a means for determining resonance of a circuit comprising:
a fixed inductive load;
a variable capacitor connected between the R/Z meter and the fixed inductive load.

19. An apparatus as recited in claim 16 wherein the polarity reversing switch converts the DC test voltage to a square wave shaped AC test voltage when the object being tested is a resistive load.

20. An apparatus as recited in claim 16 wherein the polarity reversing switch is an electronic polarity reversing switch.

21. An apparatus as recited in 16 wherein the AC test voltage has a 50% duty cycle and the square wave has a peak to peak amplitude twice that of the DC test voltage.

22. An apparatus as recited in claim 16 wherein the AC test voltage has a peak to peak amplitude twice that of the DC test voltage.

23. An apparatus as recited in claim 16 wherein the switching signal is a square wave.

24. An apparatus as recited in claim 16 wherein said apparatus further comprises a DC offset correction means connected between the DMM and the object being tested for correcting any stray resistance in the apparatus.

* * * * *